United States Patent [19]

Scepanovic et al.

[11] Patent Number: 5,578,840
[45] Date of Patent: Nov. 26, 1996

[54] MICROELECTRONIC INTEGRATED CIRCUIT STRUCTURE AND METHOD USING THREE DIRECTIONAL INTERCONNECT ROUTING BASED ON HEXAGONAL GEOMETRY

[75] Inventors: Ranko Scepanovic; James S. Koford, both of San Jose, Calif.; Valeriy B. Kudryavstev, Moscow, Russian Federation; Alexander E. Andreev, Moskovskaja, Russian Federation; Stanislav V. Aleshin; Alexander S. Podkolzin, both of Moscow, Russian Federation

[73] Assignee: LIS Logic Corporation, Milpitas, Calif.

[21] Appl. No.: 333,367

[22] Filed: Nov. 2, 1994

[51] Int. Cl.⁶ .......................... H01L 27/10; H01L 27/118
[52] U.S. Cl. .......................... 257/207; 257/206; 257/208; 257/210; 257/211
[58] Field of Search ................................... 257/206, 207, 257/210, 208, 211

[56] References Cited

U.S. PATENT DOCUMENTS

| | | | |
|---|---|---|---|
| 4,517,659 | 5/1985 | Chamberlain | 257/208 |
| 4,673,966 | 6/1987 | Shimoyama | 257/210 |
| 5,095,343 | 3/1992 | Klodzinski et al. | 357/23.4 |
| 5,117,277 | 5/1992 | Yuyama et al. | 257/210 |
| 5,130,767 | 7/1992 | Lidow et al. | 357/23.4 |
| 5,323,036 | 6/1994 | Neilson et al. | 257/287 |

FOREIGN PATENT DOCUMENTS

| | | | |
|---|---|---|---|
| 59-86248 | 5/1984 | Japan | 257/211 |
| 62-71264 | 4/1987 | Japan | 257/211 |

OTHER PUBLICATIONS

1980 IEEE International Symposium on Circuits and Systems Proceedings, 80CH1564-4, vol. 3 of 3; P. Pal Chaudhuri, "*Routing Multilayer Boards on Steiner Metric*"; pp. 961–964.

Sarrafzadeh, Majid and Wong, C. K.; "*Hierarchical Steiner Tree Construction in Uniform Orientations*"; IEEE, 1992.

*Primary Examiner*—Jerome Jackson
*Attorney, Agent, or Firm*—Poms, Smith, Lande & Rose

[57] ABSTRACT

Electrical conductors for interconnecting terminals of microelectronic cells of an integrated circuit extend in three directions that are angularly displaced from each other by 60°. The conductors pass through points defined by centers of closely packed hexagons superimposed on the circuit such that the conductors extend perpendicular to edges of the hexagons. The conductors that extend in the three directions can be formed in three different layers, or alternatively the conductors that extend in two or three of the directions can be formed in a single layer as long as they do not cross. The conductors can be formed in layers that are electrically insulated from the cells and extend over the cells, or can extend through hexagons between cells. Cells are defined by clusters of two or more hexagons, enabling a variety of cell shapes to be accommodated. Cells have serrated edges defined by edges of hexagons such that adjacent cells fit together exactly, providing a closely packed arrangement of cells on the substrate with 100% utilization of space and 100% equidistant connectivity. Sets of cells having the same functionality and different shapes are provided.

9 Claims, 13 Drawing Sheets

MICROELECTRONIC INTEGRATED CIRCUIT STRUCTURE AND METHOD USING THREE DIRECTIONAL INTERCONNECT ROUTING BASED ON HEXAGONAL GEOMETRY

BACKGROUND OF THE INVENTION

1. Field of the Invention

The present invention generally relates to the art of microelectronic integrated circuits, and more specifically to a microelectronic integrated circuit structure and method using three directional interconnect routing based on a hexagonal geometry.

2. Description of the Related Art

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design. It is an extremely tedious and an error-prone process because of the tight tolerance requirements and the minuteness of the individual components.

Currently, the minimum geometric feature size of a component is on the order of 0.5 microns. However, it is expected that the feature size can be reduced to 0.1 micron within several years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Each microelectronic circuit cell includes a plurality of pins or terminals, each of which is connected to pins of other cells by a respective electrical interconnect wire network or net. A goal of the optimization process is to determine a cell placement such that all of the required interconnects can be made, and the total wirelength and interconnect congestion are minimized.

As illustrated in FIG. 1, a conventional microelectronic integrated circuit 10 comprises a substrate 12 on which a large number of microelectronic circuits are formed. These circuits include large functional macroblocks such as indicated at 14 which may be central processing units, input-output devices or the like. A typical integrated circuit further comprises a large number of cells 16 that are arranged in a generally rectangular pattern in the areas of the substrate 12 that are not occupied by macroblocks.

The cells 16 may comprise individual logic gates, or more preferably may each comprise a plurality of logic gates that are interconnected to form functional blocks. Typically, a cell library consisting of standardized cells that perform desired logical operations are provided and are combined with other cells to form an integrated circuit having the desired functionality.

The cells 16 have terminals 18 to provide interconnections to other cells 16 on the substrate 12. Interconnections are made via vertical electrical conductors 20 and horizontal electrical conductors 22 that extend between the terminals 18 of the cells in such a manner as to achieve the interconnections required by the netlist of the integrated circuit 10. It will be noted that only a few of the elements 16, 18, 20 and 22 are designated by reference numerals for clarity of illustration.

In conventional integrated circuit design, the electrical conductors 20 and 22 are formed in vertical and horizontal routing channels (not designated) in a rectilinear (Manhattan) pattern. Thus, only two directions for interconnect routing are provided, although several layers of conductors extending in the two orthogonal directions may be provided to increase the space available for routing.

As discussed above, a goal of routing is to minimize the total wirelength of the interconnects, and also to minimize routing congestion. Achievement of this goal is restricted using conventional rectilinear routing because diagonal connections are not possible. A diagonal path between two terminals is shorter than two rectilinear orthogonal paths that would be required to accomplish the same connection.

Another drawback of conventional rectilinear interconnect routing is its sensitivity to parasitic capacitance. Since many conductors run in the same direction in parallel with each other, adjacent conductors form parasitic capacitances that can create signal crosstalk and other undesirable effects.

SUMMARY OF THE INVENTION

In accordance with the present invention, electrical conductors for interconnecting terminals of microelectronic cells of an integrated circuit extend in three directions that are angularly displaced from each other by 60°.

The conductors pass through points defined by centers of closely packed hexagons superimposed on the substrate such that the conductors extend perpendicular to edges of the hexagons.

The conductors that extend in the three directions can be formed in three different layers, or alternatively the conductors that extend in two or three of the directions can be formed in a single layer as long as they do not cross.

The conductors can be formed in layers that are electrically insulated from the cells and extend over the cells, or can extend through hexagons between cells. Cells can be defined by clusters of two or more hexagons, enabling a variety of cell shapes to be accommodated.

It is further within the scope of the invention to provide conductors that extend in two, rather than three directions that form an acute angle relative to each other. In another alternative form of the invention, additional conductors can be added that extend in a direction perpendicular to one of the other three directions.

Cells can have serrated edges defined by edges of hexagons such that adjacent cells fit together exactly, providing a closely packed arrangement of cells on the substrate with substantially 100% utilization of space and 100% adjacent equidistant connectivity. Sets of cells having the same functionality and different shapes are provided.

The present invention substantially reduces the total wire-length interconnect congestion of the integrated circuit by providing three routing directions, rather than two as in the prior art. The routing directions include, relative to a first direction, two diagonal directions that provide shorter interconnect paths than conventional rectilinear routing.

In addition, the number of conductors that extend parallel to each other is smaller, and the angles between conductors in different layers are larger than in the prior art, thereby reducing parasitic capacitance and other undesirable effects that result from conventional rectilinear routing.

These and other features and advantages of the present invention will be apparent to those skilled in the art from the following detailed description, taken together with the accompanying drawings, in which like reference numerals refer to like parts.

DETAILED DESCRIPTION OF THE INVENTION

A method of fabricating a microelectronic structure such as an integrated circuit in accordance with the present invention generally comprises superimposing a pattern of closely packed hexagons on a semiconductor substrate, and forming a plurality of microelectronic cells having terminals on the substrate.

Selected terminals are interconnected in a predetermined manner with a plurality of first, second and third electrical conductors that extend in first, second and third different directions respectively. The first, second and third electrical conductors pass through points defined by centers of the hexagons, and extend perpendicular to edges of the hexagons.

In this manner, the electrical conductors extend in three directions that are angularly displaced from each other by 60°. However, the scope of the invention further includes providing only the first and second conductors that extend in two, rather than three directions that form an acute angle relative to each other.

Figure 2:
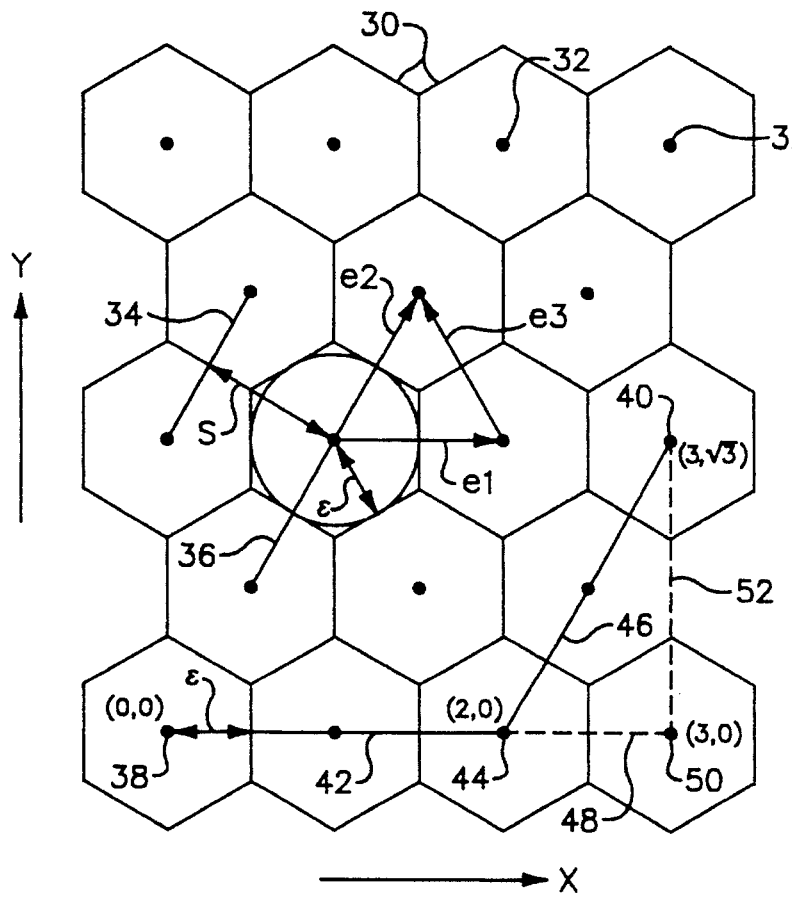
FIG. 2 is a diagram illustrating three direction routing based on hexagonal geometry in accordance with the present invention.

The geometry of the present three directional hexagonal routing arrangement is illustrated in FIG. 2. An orthogonal coordinate system has an X axis and a Y axis. A closely packed pattern of hexagons 30 is superimposed on the coordinate system, with the centers of the hexagons 30 being designated as terminal points 32.

For the purpose of the present disclosure, the term "closely packed" is construed to mean that the hexagons 30 are formed in a contiguous arrangement with adjacent hexagons 30 sharing common sides as illustrated, with no spaces being provided between adjacent hexagons 30.

In accordance with the invention, the centers of the hexagons 30 as indicated at 32 represent interconnect points for terminals of the cells. Electrical conductors for interconnecting the points 32 extend in three directions that make angles of 60° relative to each other.

As will be described in detail below, the conductors that extend in the three directions can be formed in three different layers, or alternatively the conductors that extend in two or three of the directions can be formed in a single layer as long as they do not cross.

As illustrated, a direction $e_1$ extends parallel to the X axis. A direction $e_2$ is rotated 60 degrees counterclockwise from the direction $e_1$, whereas a direction $e_3$ is rotated 120 degrees counterclockwise from the direction $e_1$. If the directions $e_1$, $e_2$ and $e_3$ are represented by vectors having a common length as illustrated in FIG. 2, they form an equilateral triangle. For convenience, the notation $e_1$, $e_2$ and $e_3$ is used to denote the vectors that extend in the respective routing directions as well as the directions themselves. The radius of the circles that are inscribed by the hexagons 30 is designated as $\epsilon$.

The vectors $e_1$, $e_2$ and $e_3$ can be defined using the following notation.

$$e_1 = (1, 0), e_2 = [(1/2), (\sqrt{3}/2)], e_3 = e_1 - e_2.$$

The geometric structure of the present invention can also be defined using set theory. A set $SIX(\alpha,\epsilon)$ of regular hexagons have centers at points $\alpha$, sides that are perpendicular to the vectors $e_1$, $e_2$ and $e_3$, and radii of inscribed circles equal to $\epsilon$ as described above. A set SU of points in a plane is denoted by $x_1 e_1 + x_2 e_2$, where $x_1$ and $x_2$ are integers.

The set $SIX(\alpha,½)$ for all $\alpha$ from the set SU intersect only on the edges of the hexagons and partition the plane into the closely packed arrangement as illustrated. Circles inscribed in these hexagons are also densely packed.

As further illustrated in FIG. 2, the perpendicular distance S between two adjacent conductors extending in the direction $e_2$, such as conductors 34 and 36, is equal to S= $\sqrt{3}/2$=0.87 measured in X–Y coordinates, or S=$\sqrt{3}$ $\epsilon$=1.73$\epsilon$. The perpendicular distances between adjacent conductors extending in the other two directions $e_1$ and $e_2$ is the same as for the direction $e_2$.

An advantage of the present hexagonal routing arrangement is that the wirelength of conductors interconnecting two diagonally separated terminals is substantially less than with conventional rectilinear routing. As illustrated in FIG. 2, terminal points 38 and 40 to be interconnected are located at (x,y) coordinates (0,0) and (3,$\sqrt{3}$) respectively.

Using the present routing arrangement, the points 38 and 40 can be connected by a first conductor 42 extending in the direction $e_1$ from the point 38 to a point 44 at coordinates (2,0), and a second conductor 46 extending from the point 44 in the direction $e_2$ to the point 40. The length of each of the conductors 42 and 46 is 2, and the total connection length is 4.

Using the conventional rectilinear routing method, connection between the points 38 and 40 also requires the conductor 42 from the point 38 to the point 44. However, rather than the diagonal conductor 46, the conventional method requires two conductors, a conductor 48 from the point 44 to a point 50 at coordinates (3,0), and a conductor 52 from the point 50 to the point 40.

The combined length of the conductors 42 and 48 is 3, whereas the length of the conductor 52 is $\sqrt{3}$. The total length of the conventional rectilinear interconnect path is therefore 3+$\sqrt{3}$=4.73. The conventional path length between the points 38 and 40 is therefore 18.3% longer than the present path length.

The reduction of 18.3% in pathlength is approximately the average that is attained using the present hexagonal routing arrangement, although individual cases can vary from this value. However, the distance between any two points using rectilinear routing cannot be shorter than that using the present hexagonal routing in any case.

Figure 3:
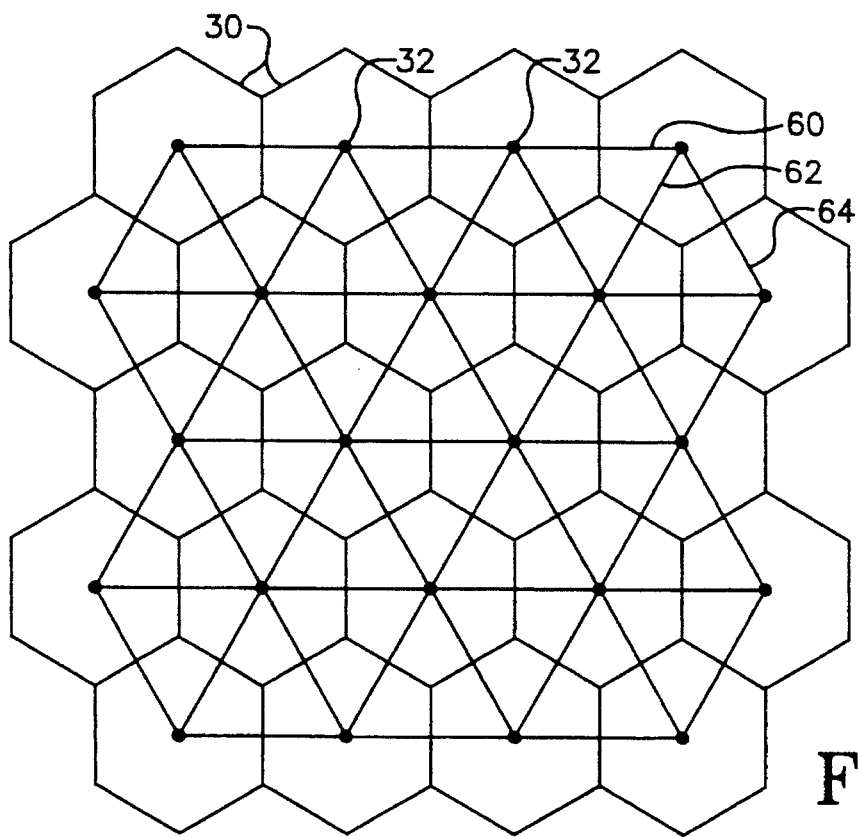
FIG. 3 is a diagram illustrating how the present three direction routing geometry creates a rigid lattice structure.

FIG. 3 illustrates a unique property of the present hexagonal routing arrangement. The centers of the hexagons 30 or points 32 are illustrated as all being interconnected by conductors 60 extending in the direction $e_1$, conductors 62 extending in the direction $e_2$ and conductors 64 extending in the direction $e_3$. The conductors 60, 62 and 64 interconnecting the centers 32 of any three adjacent hexagons 30 form an equilateral triangle. For this reason, a lattice constituted by the conductors 60, 62 and 64 is rigid, and cannot be deformed without changing the lengths of the conductors. This feature increases the strength and integrity of the integrated circuit.

Figure 1:
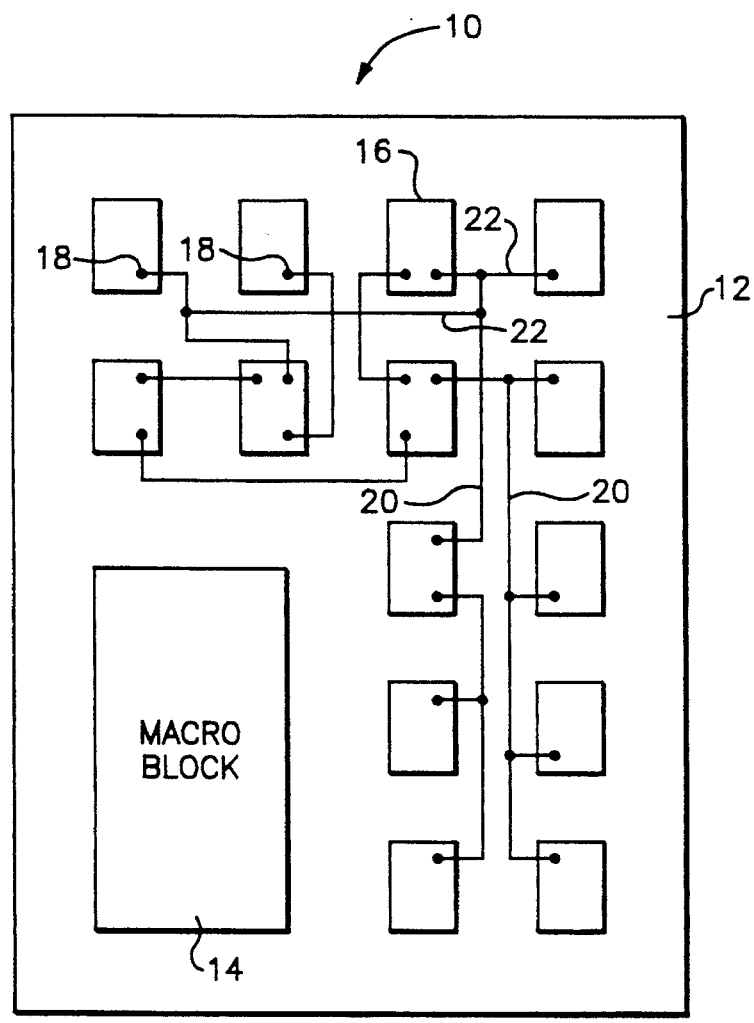
FIG. 1 is a simplified diagram illustrating a conventional rectilinear integrated circuit interconnect routing arrangement.
Figure 4A:
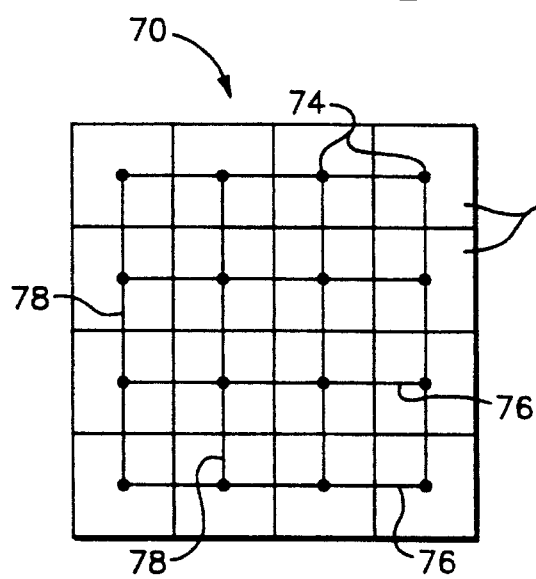
FIGS. 4a and 4b are diagrams illustrating how a conventional rectilinear routing structure forms a lattice structure that can be easily deformed.
Figure 4B:
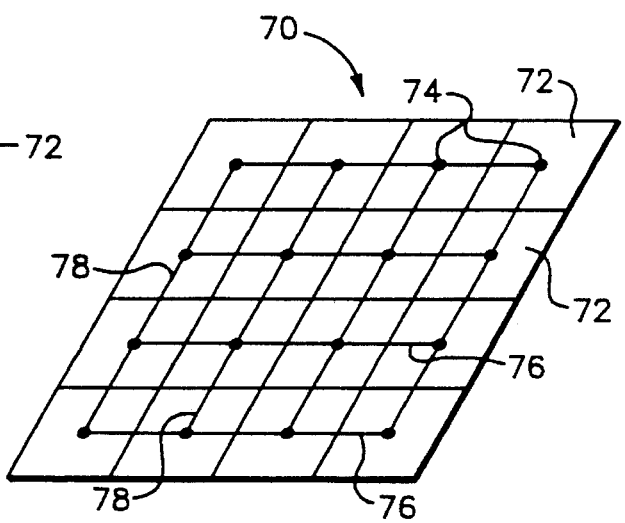

In contrast, FIGS. 4a and 4b illustrate a conventional rectilinear routing arrangement 70 including rectangular cells 72 having centers 74 that are interconnected by horizontal conductors 76 and vertical conductors 78. The conductors 76 and 78 form a lattice in the shape of a parallelogram that can be deformed from a rectilinear shape as illustrated in FIG. 4a into a non-rectilinear shape as illustrated in FIG. 4b without changing the lengths of the conductors 76 and 78.

Figure 5:
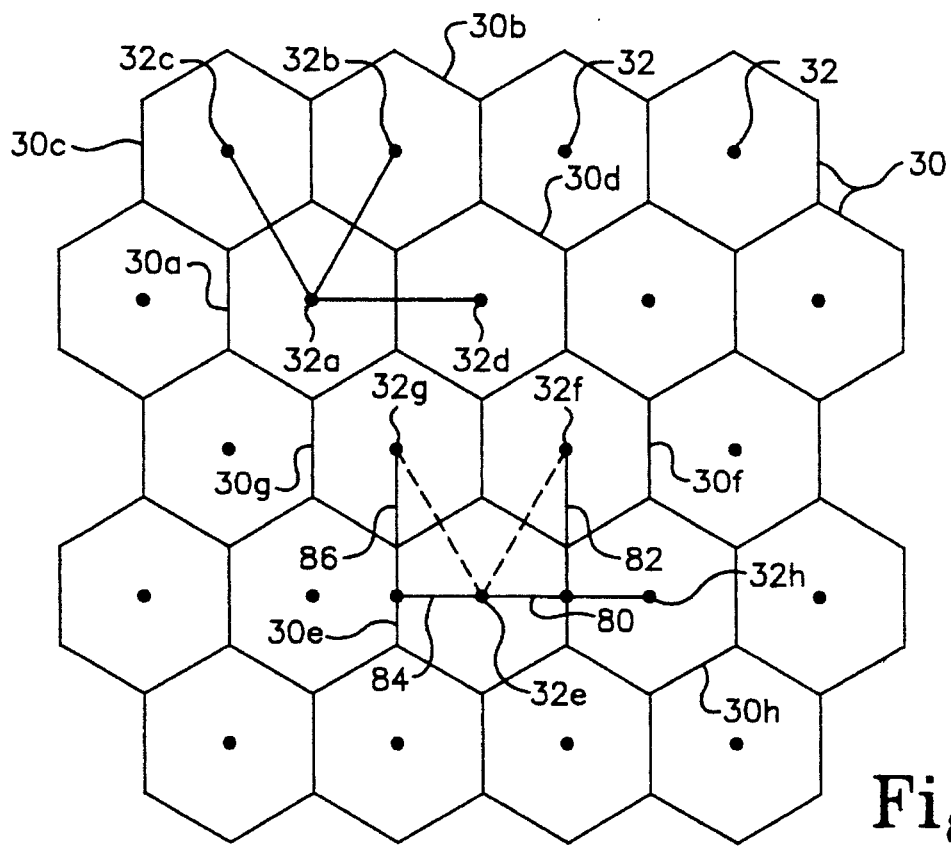
FIG. 5 is a diagram illustrating how the present routing arrangement produces 100% adjacent equidistant connectivity of cells.

FIG. 5 illustrates another desirable property of the present hexagonal routing arrangement in that it provides 100% equidistant connectivity between all adjacent cells, thereby enabling three degrees of freedom for routing between neighboring cells.

As shown in the drawing, the distances between a center 32a of a hexagon 30a and centers 32b, 32c and 32d of hexagons 30b, 30c and 30d that are adjacent to the hexagon 30a are all equal to one in X–Y coordinates, or 2$\epsilon$. Although not explicitly illustrated, the distances between the center 32a and the centers of the other hexagons 30 that are adjacent to the hexagon 30a are also one.

In this manner, the centers of all hexagons 30 that are adjacent to a particular hexagon 30 are all equidistant from the center of the particular hexagon 30, and the adjacent equidistant connectivity is 100%.

In contrast, using conventional rectilinear routing as applied to the hexagonal cell arrangement of FIG. 5, the distance from a center 32e of a hexagon 30e to a center 32h of an adjacent hexagon 30h is one. However, the center 32e must be connected to centers 32f and 32g of hexagons 30f and 30g by rectilinear conductors 80,82 and 84,86 respectively, each of the paths having a length of 0.5+$\sqrt{3}/2$=1.37 which is greater than one.

Figure 6:
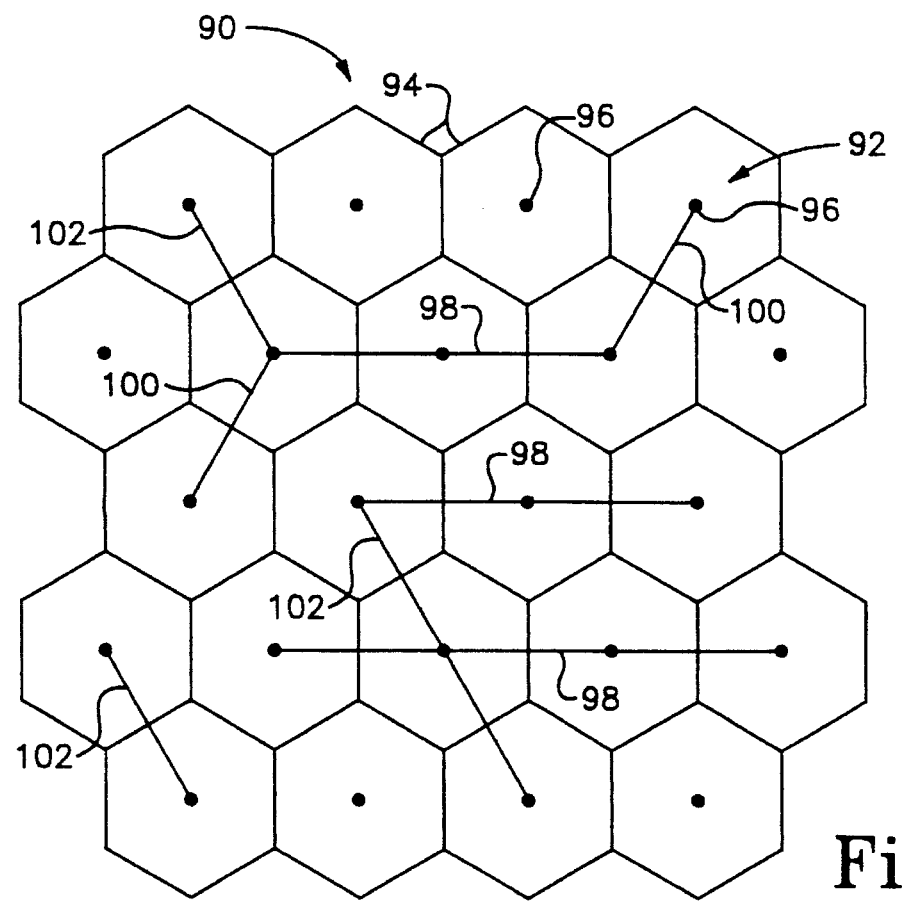
FIG. 6 is a diagram illustrating a microelectronic integrated circuit according to the present invention in which electrical conductors extending in three directions are formed in a single layer.

FIG. 6 illustrates a simplified form of the invention, in which electrical conductors extending in three directions for interconnecting terminal points are all provided in one routing layer. In this configuration, it is necessary that the conductors extending in different directions do not cross each other, as this would cause the crossing conductors to be shorted together.

In the illustrated example, cells have hexagonal shapes that correspond to the hexagons themselves, and each cell (hexagon) has one terminal corresponding to its center or point.

More specifically, a microelectronic structure, preferably an integrated circuit as indicated at 90, comprises a substrate 92 on which are formed hexagonal microelectronic cells 94 having centers that constitute terminals 96 for interconnection with other cells 94. The terminals 96 of selected cells are interconnected in a predetermined manner based on the netlist of the circuit 90 by first electrical conductors 98 that extend in the direction $e_1$ as described with reference to FIG. 2, second electrical conductors 100 that extend in the direction $e_2$ and third electrical conductors 102 that extend in the direction $e_3$.

It will be noted that no two conductors extending in different directions cross each other. If two conductors extending in different directions are connected to a particular terminal 96, the conductors are connected to each other.

The conductors 98, 100 and 102 can be formed on the same layer as the cells 94, or alternatively the conductor layer can be electrically insulated from the layer on which the cells are formed. For example, the cells 94 can be formed directly on the substrate 92, and an electrically insulating layer (not shown) of, for example, silicon dioxide, can be formed over the substrate 92 and the cells 94. The conductors 98, 100 and 102 are then formed in a single layer over the insulating layer.

If the conductor layer is insulated from the cell layer, the conductors 98, 100 and 102 are connected to the terminals 96 by electrically conductive feedthroughs or vias that extend through holes (not shown) in the insulating layer.

Figure 7:
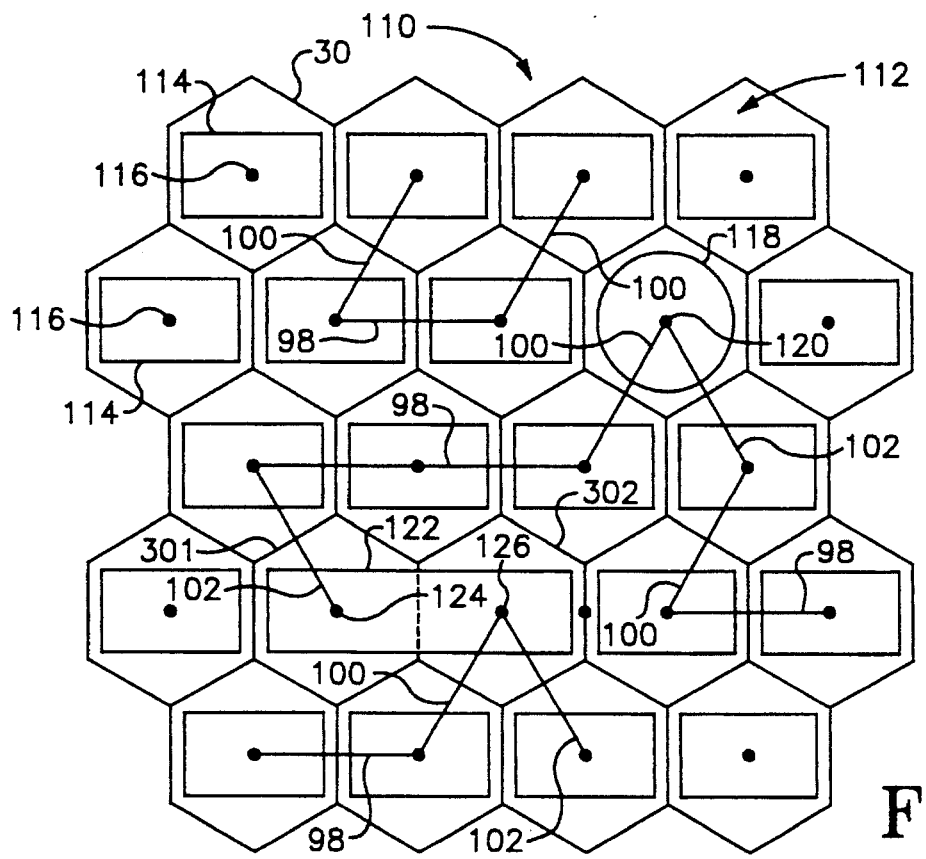
FIG. 7 is a diagram illustrating how microelectronic cells of different shapes and sizes can be accommodated using the present routing arrangement.

Whereas the cells 94 of FIG. 6 have the same hexagonal shape as the hexagons 30 of FIG. 2, FIG. 7 illustrates an embodiment of the invention in which the cells have shapes that are different from the hexagons 30. In this case, the hexagons 30 are not an actual part of the integrated circuit, but are superimposed on the circuit in an imaginary pattern to define the points and directions for the hexagonal routing conductors.

As viewed in FIG. 7, an integrated circuit 110 comprises a substrate 112 on which a plurality of cells are formed. Each of the cells is formed within a single hexagon 30, or within a cluster of adjacent hexagons 30.

As shown, the circuit 110 comprises a plurality of rectangular cells 114 having terminals 116 disposed at the centers of respective hexagons 30. Each cell 114 is formed within a single hexagon 30 and has a single terminal 116.

Further illustrated is a circular cell 118 having a center 120. The cell 118 is preferably inscribed in the respective hexagon 30 to maximize the size of the cell 18, but may be smaller if desired.

The integrated circuit 110 further comprises a rectangular cell 122 that is disposed within a cluster consisting of two adjacent hexagons $30_1$ and $30_2$. The cell 122 has two terminals 124 and 126 located at the centers of the hexagons $30_1$ and $30_2$ respectively.

In general, as will be described in detail below, cells having terminals that are interconnected in accordance with the present hexagonal routing arrangement can have any shape, and can be formed in clusters comprising any number of adjacent hexagons 30.

The terminals 116, 120, 124 and 126 are interconnected in a desired manner by the electrical conductors 98, 100 and 102 extending in the directions $e_1$, $e_2$ and $e_3$ respectively as illustrated and described with reference to FIG. 6.

Figure 8:
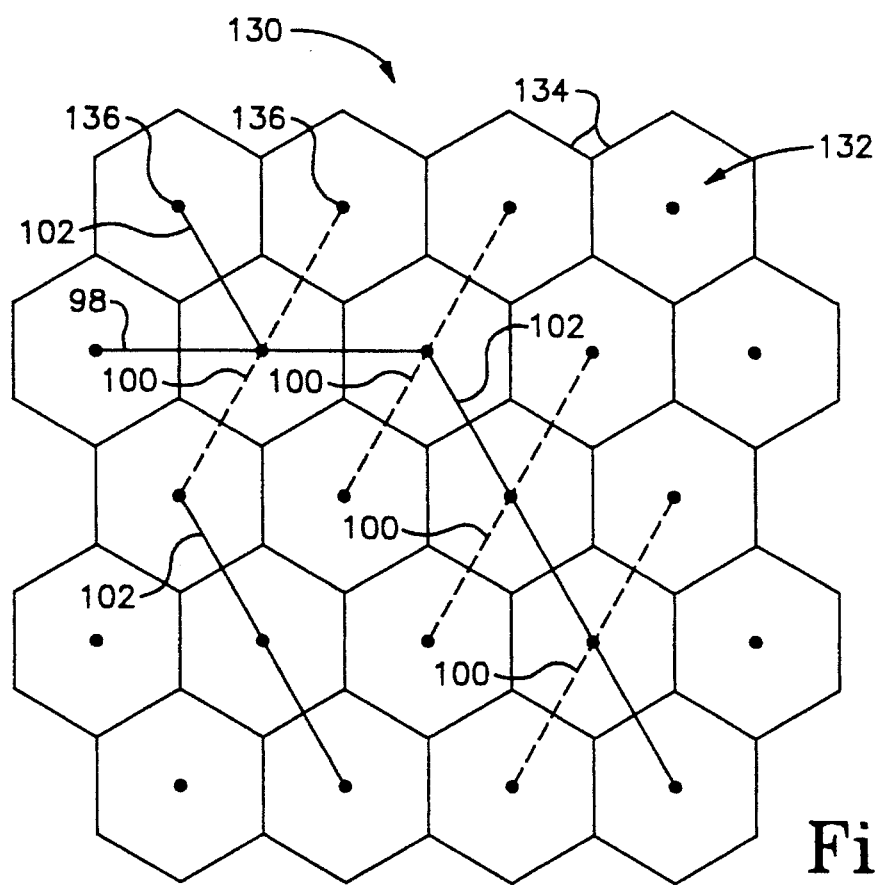
FIG. 8 is similar to FIG. 6, but illustrates an arrangement in which electrical conductors extend in two directions in one routing layer, whereas electrical conductors extend in a third direction in a second routing layer.

FIG. 8 illustrates another embodiment of the invention in which the electrical conductors extending in two directions are formed in a first layer, whereas the electrical conductors extending in the third direction are formed in a second layer that is electrically insulated from the first layer.

An integrated circuit 130 comprises a substrate 132 on which are formed a plurality of hexagonal shaped cells 134 having terminals 136. It will be noted, however, that the invention is not so limited, and that the cells 134 can have other shapes and can occupy more than one hexagon as described with reference to FIG. 7.

In this case, the electrical conductors 98 that extend in the direction $e_1$ and the conductors 102 that extend in the direction $e_3$ are formed in a first layer, whereas the conductors 100 that extend in the direction $e_2$ are formed in the second layer. An electrically insulating layer that separates the two conductor layers, as well as an optional insulating layer that separates the conductor layers from the cells 134 on the substrate 132, are not explicitly illustrated.

Any conductors 98 and 102 that are both connected to a particular terminal 136 are thereby connected to each other. However, intermediate portions of conductors 98, 100 and 102 that extend over particular terminals 136 may or may not be connected to these terminals. If such a conductor is formed in a layer that is insulated from the cell layer and connection is desired, such can be provided by a feedthrough as described above.

Figure 9:
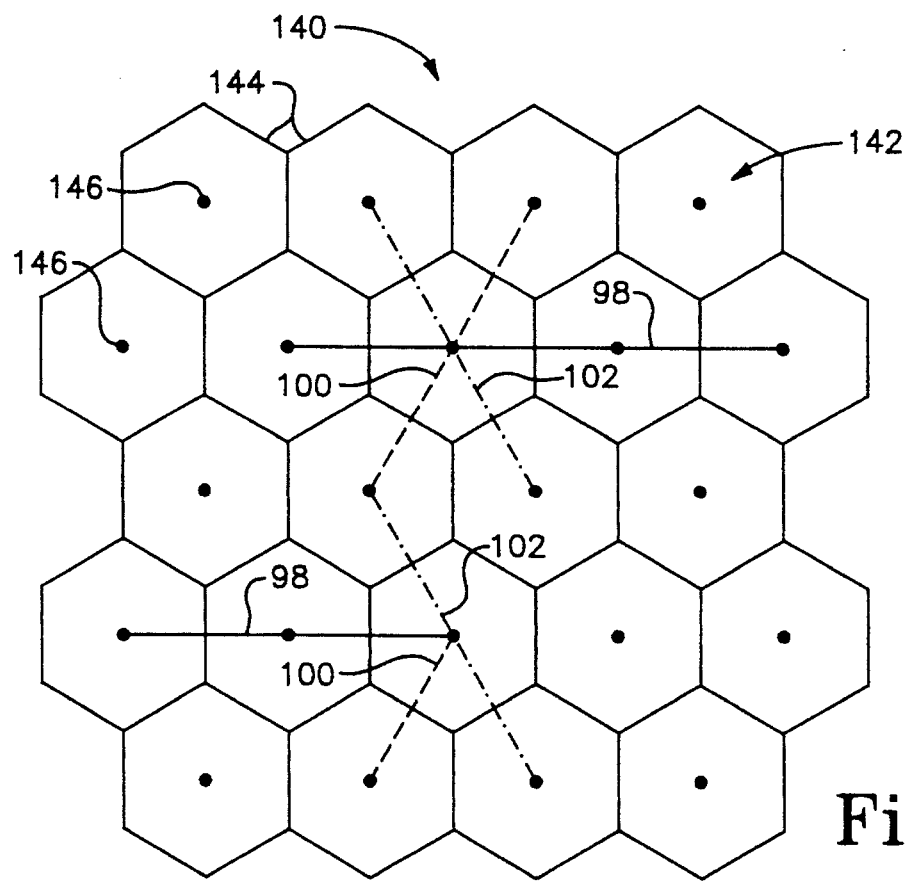
FIG. 9 is a diagram illustrating electrical conductors extending in three directions in three routing layers respectively.

FIG. 9 illustrates another embodiment of the invention in which the electrical conductors extending in the three directions are formed in three layers respectively that are electrically insulated from each other. An integrated circuit 140 comprises a substrate 142 on which hexagonal cells 144 having terminals 146 are formed. Desired terminals 146 are interconnected by the conductors 98, 100 and 102, intermediate portions of which may or may not be connected to underlying terminals 146 by feedthroughs as described above.

In the embodiment of FIG. 9, one of the layers of conductors 98, 100 and 102 can be formed on the cell layer, or all of the conductor layers can be insulated from the cell layer.

Figure 10:
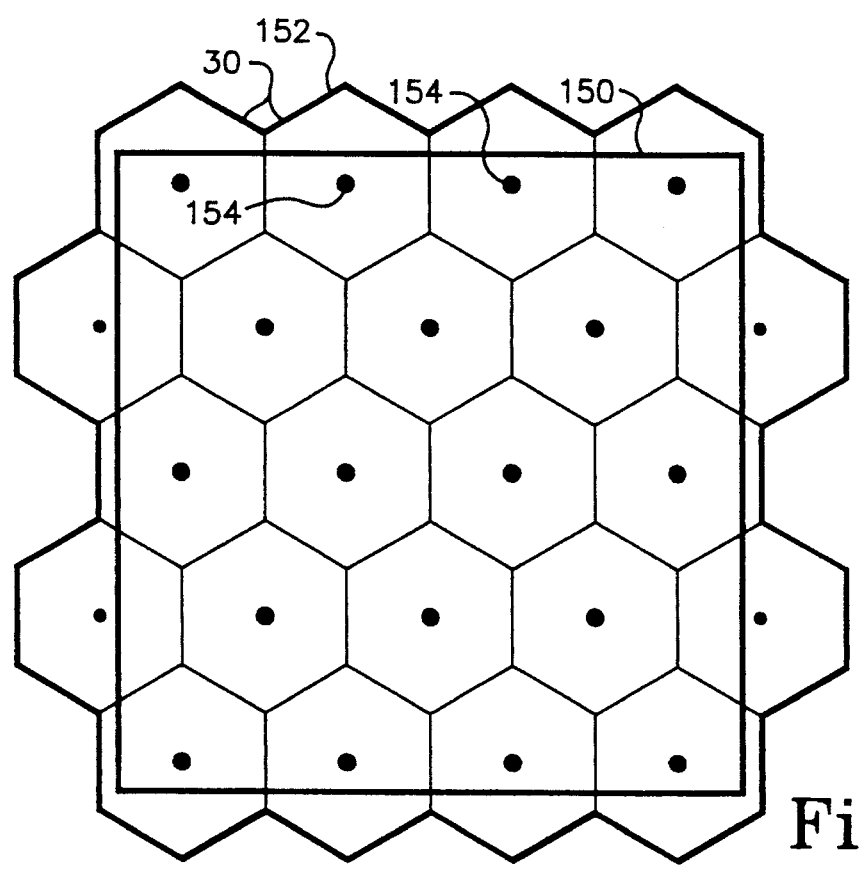
FIG. 10 is a diagram illustrating a square shaped cell formed in a cluster of hexagons superimposed on a substrate in order to provide a plurality of terminals available for routing.

As described above with reference to FIG. 7, a cell of any shape can be formed within a cluster of any number of adjacent hexagons 30. As illustrated in FIG. 10, a square cell 150 is formed within a cluster 152 (as indicated in bold line) consisting of 22 adjacent hexagons 30. The cell has 18 terminals 154 located at centers of the corresponding hexagons.

Another advantageous feature of the present hexagonal routing arrangement is that cells of various shapes can be more closely approximated by clusters of hexagons than by rectangular shapes as in the prior art.

Figure 11:
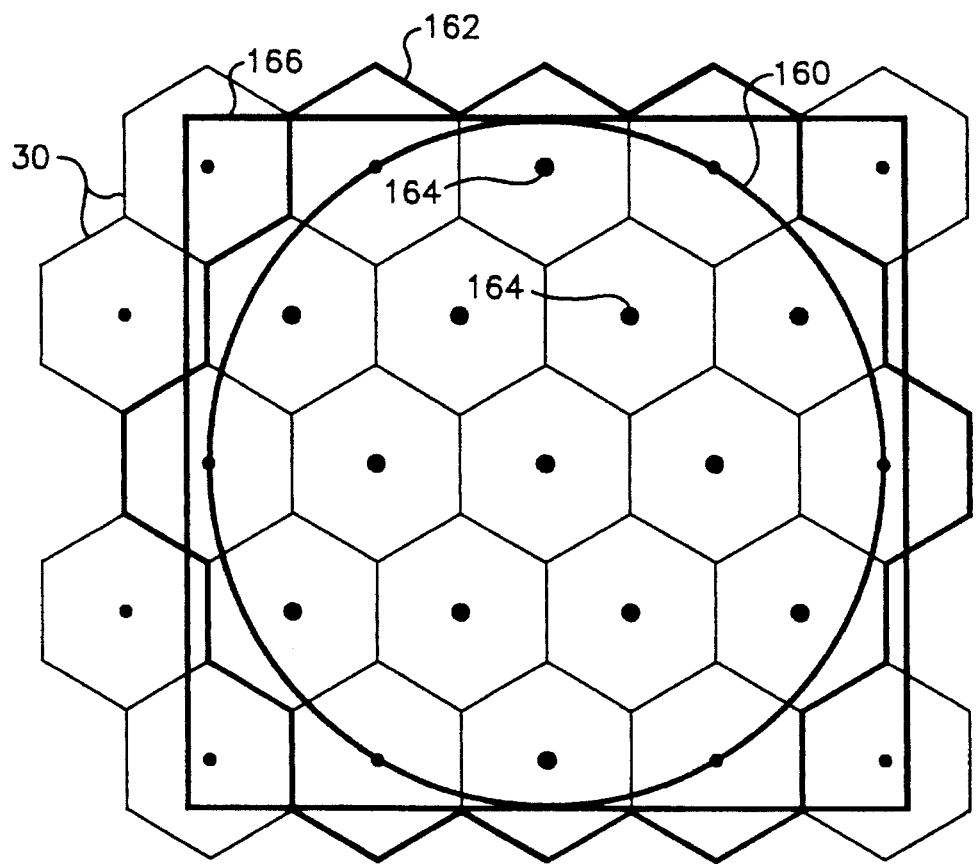
FIG. 11 is similar to FIG. 10, but illustrates a circular shaped cell.

FIG. 11 illustrates a circular cell 160 that is formed within a cluster 162 of 19 adjacent hexagons 30 and has 13 terminals 164. Further illustrated is a square 166 that circumscribes the cell 160 to show how the shape of the hexagonal cluster 162 conforms more closely to the cell 160 than does the square 166.

Figure 12:
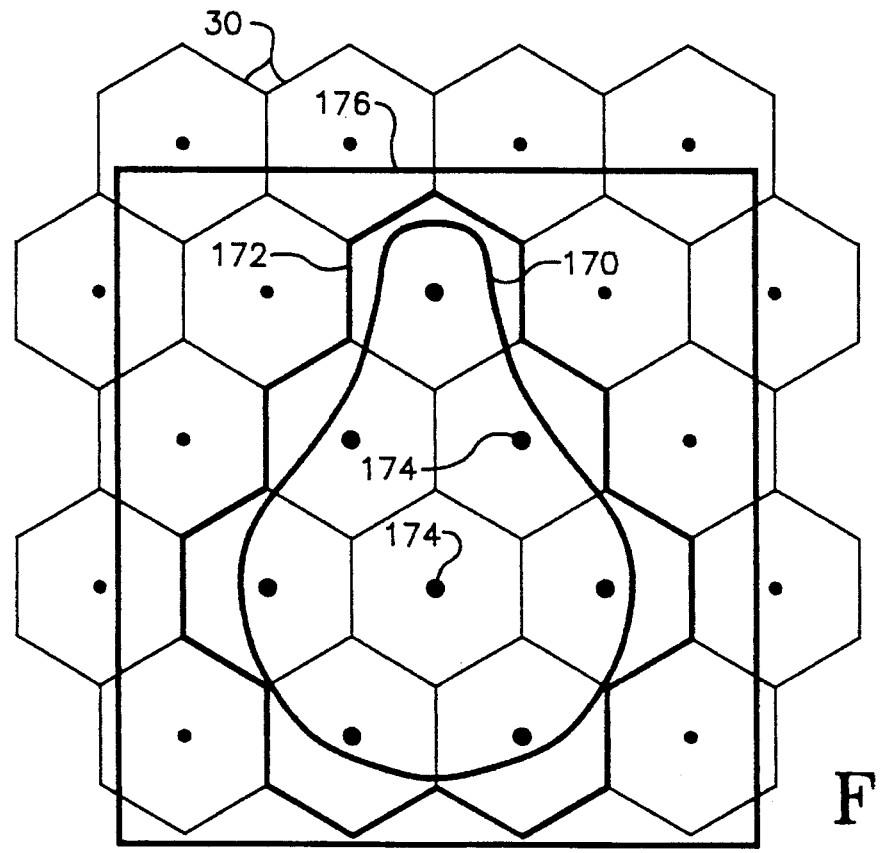
FIG. 12 is also similar to FIG. 10, but illustrates a cell having an arbitrary irregular shape.

FIG. 12 illustrates an irregular, generally gourd-shaped circular cell 170 that is formed within a cluster 172 of 8 adjacent hexagons 30 and has 8 terminals 174. Further illustrated is a rectangle 176 that circumscribes the cell 170 to show how the shape of the hexagonal cluster 172 conforms more closely to the cell 170 than does the rectangle 176.

Figure 13:
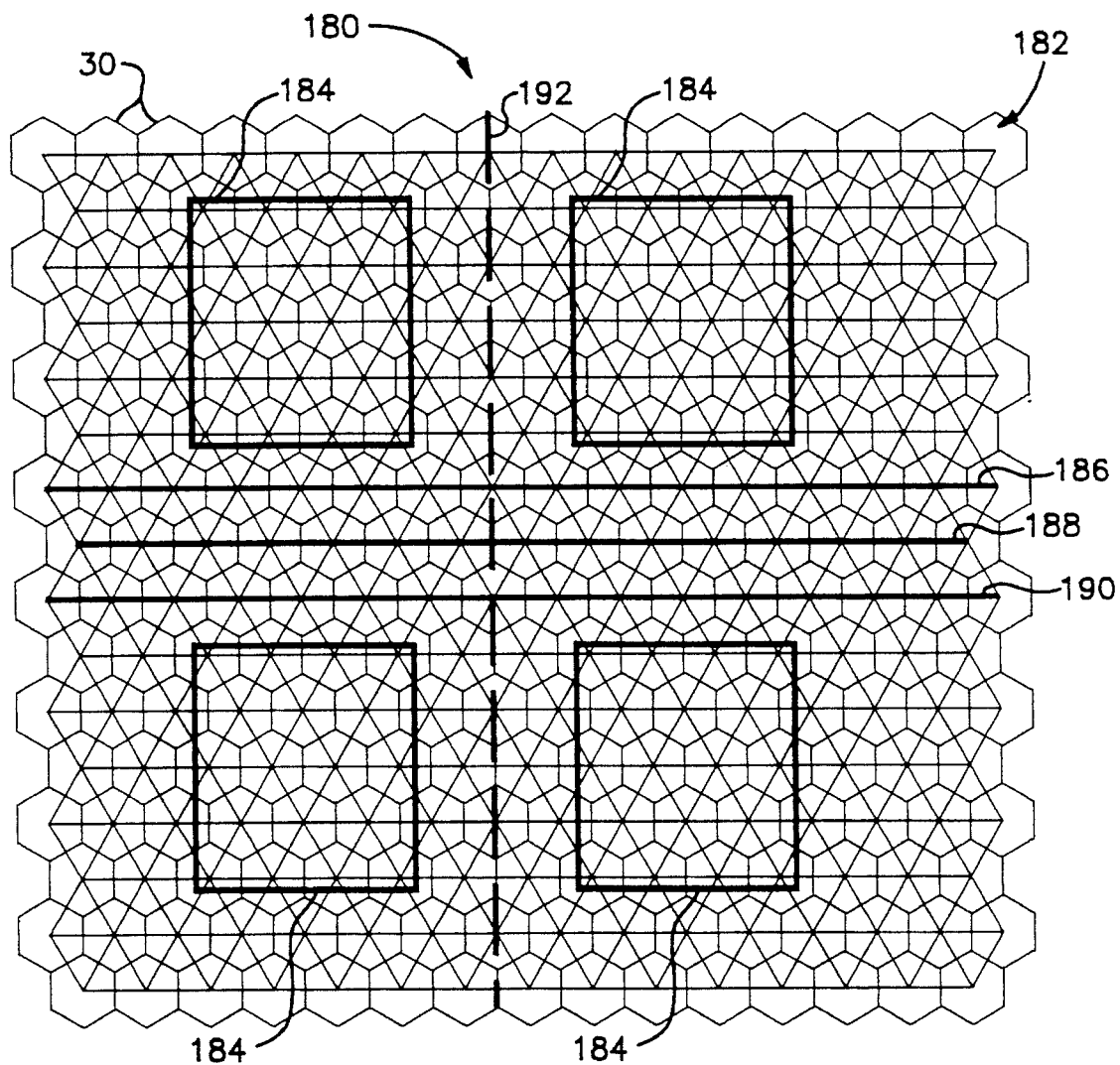
FIG. 13 is a diagram illustrating a microelectronic integrated circuit according to the present invention comprising a plurality of cells, and electrical conductors extending between the cells in two directions.

FIG. 13 illustrates an integrated circuit 180 comprising a substrate 182 on which are formed a plurality of cells 184 similar to the cell 150 of FIG. 10. Each cell 184 is formed within a cluster comprising a plurality of hexagons 30. Although not explicitly illustrated, terminals of the cells 184 are interconnected by electrical conductors extending in the three directions as described above.

The integrated circuit 180 further comprises at least one, in the illustrated example three, electrical conductors 186, 188 and 190 that extend in the direction $e_1$ through the centers of hexagons 30 that are spaced between the upper and lower cells 184. The conductors 186, 188 and 190 may constitute, for example, power, ground and clock signal connections, and are connected, although not explicitly illustrated, to terminals in the cells 184 by conductors extending in the directions $e_2$ and $e_3$.

The conductors 186, 188 and 190 may be formed in the same layer as the other conductors in the $e_1$ layer, or may alternatively be formed on the cell layer in another layer that is electrically insulated from both the $e_1$ layer and the cell layer. It is further within the scope of the invention to provide one or more of the conductors 186, 188 and 190 in the $e_1$ layer, and one or more of the other conductors 186, 188 and 190 in the cell layer or in another layer.

Although the present invention specifically relates to providing a hexagonal routing arrangement including conductors extending in three directions that are rotated by 60° from each other, the invention does not preclude adding one or more conductors in additional layers. In this regard, FIG. 13 further illustrates an additional electrical conductor 192 that extends between the left and right cells 184 perpendicular to the direction $e_1$. The conductor 192 is formed in a fourth layer that is electrically insulated from the other three layers in order to prevent shorting the other conductors together.

Figure 14:
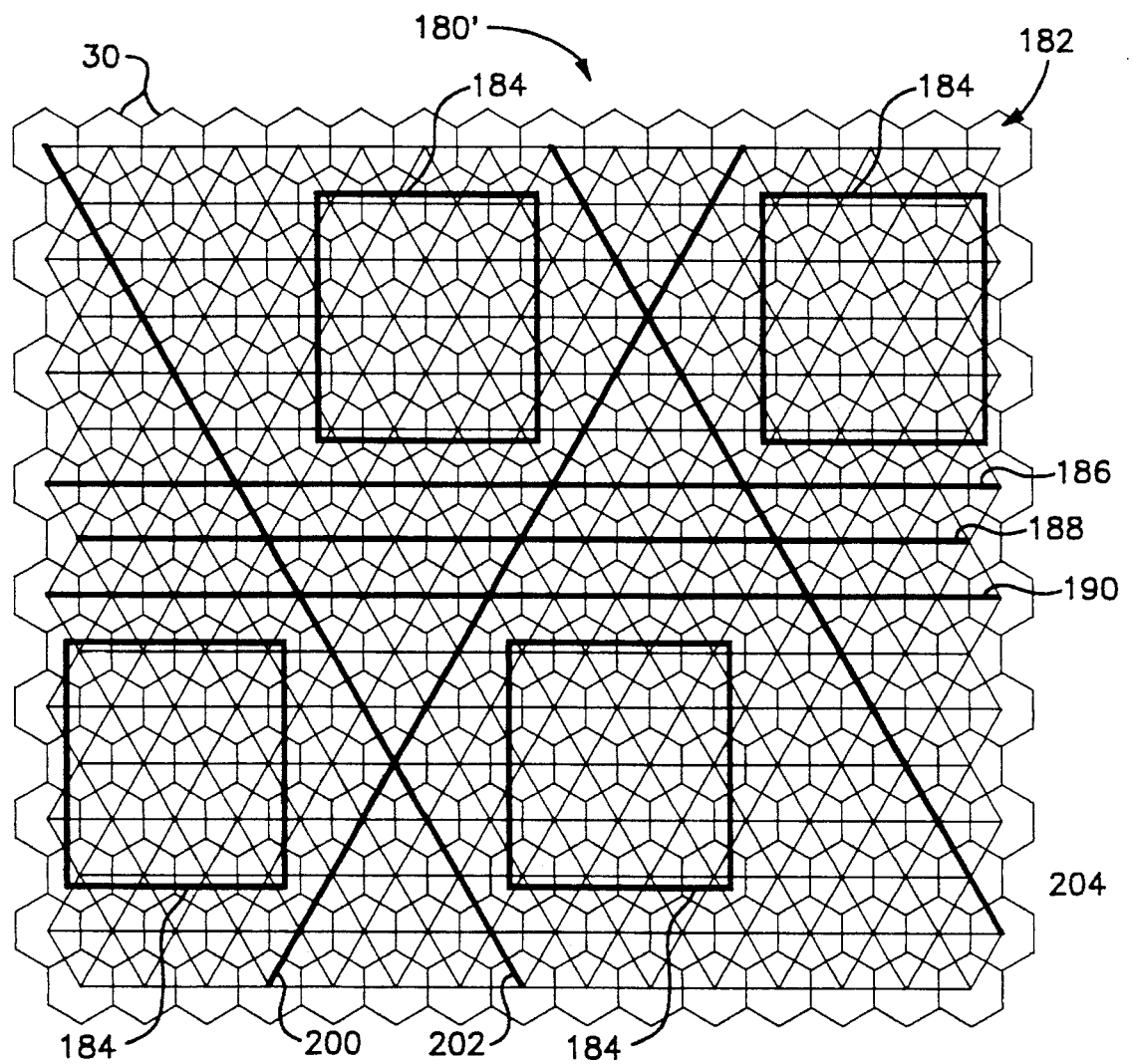
FIG. 14 is similar to FIG. 13, but illustrates electrical conductors extending in three directions between the cells.

FIG. 14 illustrates another integrated circuit 180' embodying the present invention which is similar to the circuit 180 of FIG. 13, and in which like elements are designated by the same reference numerals In the circuit 180' the upper and lower cells 184 are staggered in the direction $e_1$ to enable a conductor 200 that extends in the $e_2$ direction and conductors 202 and 204 that extend in the $e_3$ direction to be provided between the cells 184 as illustrated. The conductors 200, 202 and 204 can be provided in the same layers as the other conductors extending in the respective directions, or can be formed in separate layers and insulated from the other layers.

FIGS. 10, 11 and 12 illustrate how a cell having any essentially arbitrary shape can be provided within a cluster of hexagons for the purpose of three dimensional routing as described above. FIGS. 15 to 19 illustrate how microelectronic cells can be advantageously defined by clusters of cells having serrated edges such that adjacent cells fit together exactly, thereby eliminating spaces between adjacent cells and enabling substantially 100% utilization of space by the cells on the substrate.

Figure 15:
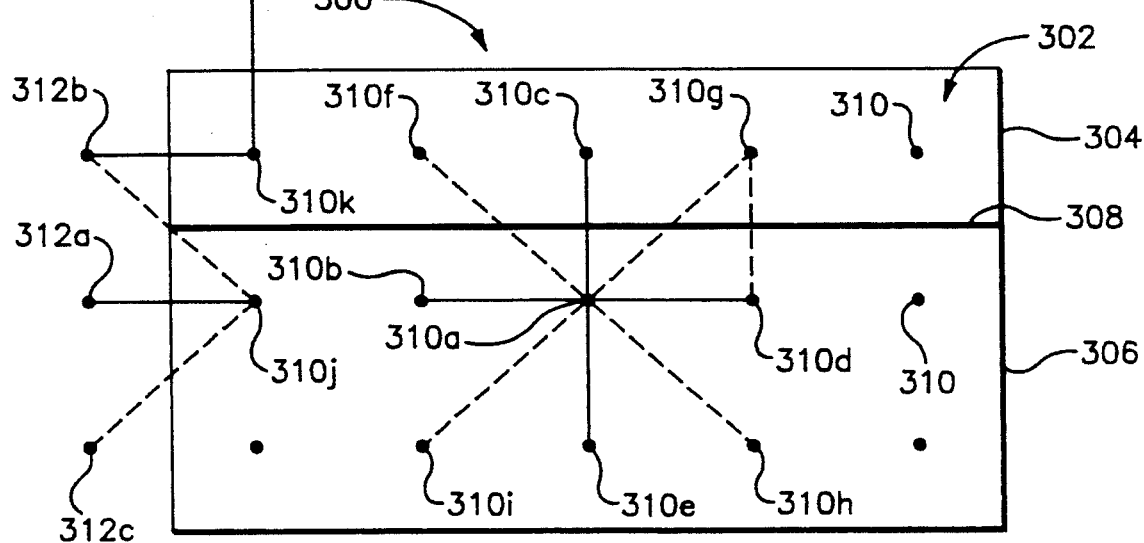
FIG. 15 is a diagram illustrating adjacency relationships in a prior art microelectronic integrated circuit arrangement.

For purposes of comparison, FIG. 15 illustrates a prior art integrated circuit 300 including a substrate 302 on which are formed first and second rectangular cells 304 and 306 respectively that share a common edge or border 308. The cells 304 and 306 comprise interconnect pins or terminals 310 are formed in a conventional rectangular arrangement.

The rectilinear distances from an exemplary terminal 310a to rectangularly adjacent terminals 310b, 310c, 310d and 310e are equal. However, the rectilinear distances from the terminal 310a to diagonally adjacent terminals 310f, 310g, 310h and 310i are longer than the distances from the terminal 310a to the rectangularly adjacent terminals 310b, 310c, 310d and 310e.

Assuming that the vertical and horizontal spacings between the terminals 310 are equal, the rectilinear distances from the terminal 310a to the diagonally adjacent terminals 310f, 310g, 310h and 310i will be twice as long as the rectilinear distances between the terminal 310a to rectangularly adjacent terminals 310b, 310c, 310d and 310e.

For this reason, the adjacent equidistant connectivity of terminals in the prior art rectilinear arrangement is 50%. This ratio is even lower for connections to external terminals. For example, the rectilinear distances from a terminal 310j at an edge of the circuit 300 to diagonally adjacent external pins or terminals 312b and 312c is twice as long as to a rectangularly adjacent external terminal 312a, such that the adjacent equidistant connectivity is 33.3%. It will be noted, however, that the distances from a terminal 310k at a corner of the circuit 300 to rectangularly adjacent external terminals 312b and 312d on the adjacent edges that share the corner are equal.

In addition, the rectilinear distances between each terminal and its diagonally adjacent terminals is twice as long as between the terminal and its rectangularly adjacent terminals. If three directional routing were applied to the arrangement of FIG. 15 such that diagonally adjacent terminals were connected by diagonal interconnects extending at 45° angles to the rectilinear directions, the lengths of the diagonal interconnects would be $\sqrt{2}=1.41$ times longer than rectilinear interconnects between rectangularly adjacent terminals.

Figure 16:
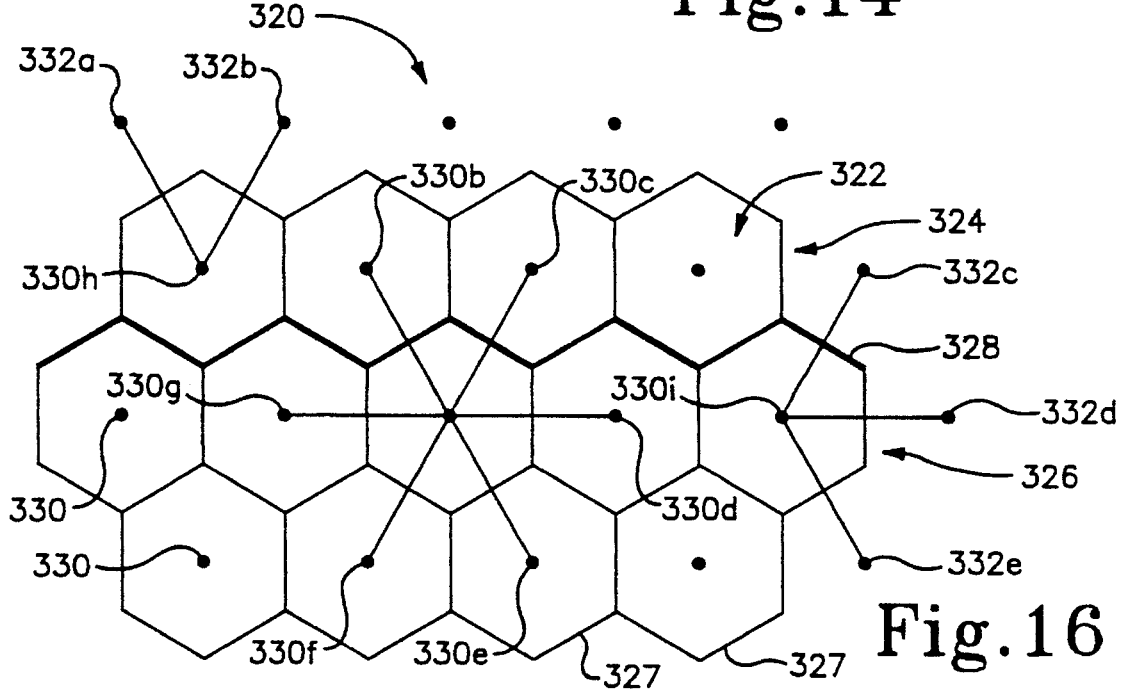
FIG. 16 is similar to FIG. 16, but illustrates adjacency relationships in a microelectronic integrated circuit arrangement according to the present invention.

FIG. 16 illustrates an integrated circuit 320 according to the present invention including a substrate 322 on which are formed first and second cells 324 and 326 respectively that are defined by clusters of hexagons 327 and share a common edge or border 328 having a serrated shape. The cells 324 and 326 comprise interconnect pins or terminals 330 that are located at the centers of the hexagons 327.

The distances from a terminal 330a to all of the six adjacent terminals 330b, 330c, 330d, 330e, 330f and 330g are equal, providing 100% equidistant connectivity. Since each terminal 330 has adjacent equidistant connectivity to six terminals, as compared to four terminals in the prior art arrangement of FIG. 15, the present invention provides an increase of 50% in adjacent equidistant connectivity over the prior art. This is made possible by the hexagonal cell arrangement as illustrated.

The 100% adjacent equidistant connectivity in accordance with the present invention is also valid for connections to external pins or terminals. As illustrated, the distances between a terminal 330h and two adjacent external terminals 332a and 332b above the upper edge of the cell 324 are equal. Similarly, the distances between a terminal 330i and external terminals 332c, 332d and 332e adjacent to the right edge of the cells 324 and 326 are equal.

Figure 17:
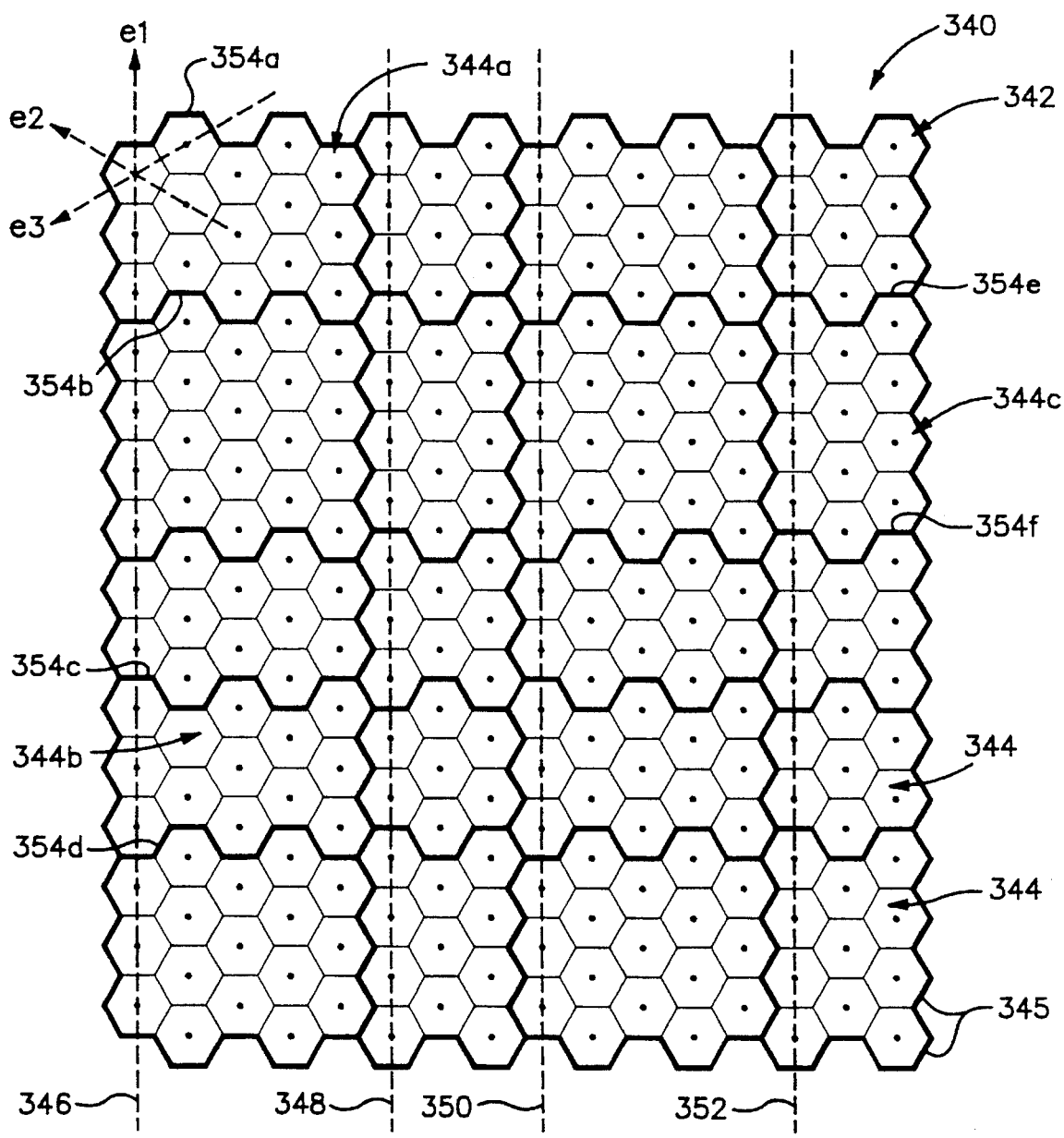
FIG. 17 is a diagram illustrating a microelectronic integrated circuit according to the present invention comprising cells defined by clusters of hexagons, with each cell having four serrated edges.

FIG. 17 illustrates how generally rectangular cells can be provided in accordance with the present invention having serrated edges defined by edges of hexagons in order to take advantage of the 100% adjacent equidistant connectivity relationship described with reference to FIG. 16. The serrated edge shape also increases the effective length of each edge by $2/°\sqrt{3}=1.15$ or 15%, which is especially advantageous in integrated circuits in which constraints are imposed by pad limited design.

The arrangement of FIG. 17 is advantageous for an application in which cells are arranged in columns, such that the cells in each column have the same width. The three directional coordinate has been rotated counterclockwise by 90° from the orientation of FIG. 2 such that the $e_1$ direction is vertical.

As illustrated in FIG. 17, an integrated circuit 340 comprises a substrate 342 on which are formed a plurality of microelectronic cells 344, each being defined by clusters of hexagons 345. The cells 344 fit together perfectly such that adjacent serrated edges thereof are congruent, enabling 100% utilization of space on the substrate with 100% adjacent equidistant connectivity between terminals.

The example of FIG. 17 includes four columns of cells 344, although this is merely exemplary. The columns can have equal width, or different widths as illustrated. The $e_1$ direction is parallel to the column direction, thereby enabling power and ground busses to be easily connected to all of the cells in a particular column as indicated by lines 346, 348, 350 and 352.

In order to fit together congruently, adjacent edges of cells must have opposite "geometric sense". For the purpose of the present disclosure, the term "geometric sense" is defined to mean that a serrated edge with one geometric sense, e.g. male, has a shape that is conjugate to a serrated edge with the opposite geometric sense, e.g. female. In colloquial terms, the male edge has "zigs" where the female edge has "zags", and vice-versa.

Using the line 346 as a reference, for example, upper and lower edges 354a and 354b of a cell 344a are defined as having "female" and "male" geometric sense because the line 346 passes through concave and convex portions of the edges 354a and 354b respectively.

A cell 344b has upper and lower male edges 354c and 354d because the line 346 passes through convex portions thereof. An exemplary cell 344c having male and female upper and lower edges 354e and 354f through which the line 352 passes respectively is also illustrated.

The male and female edges differ from each other only in that they are shifted horizontally by one cell pitch (S= $\sqrt{3}/2$=0.87) relative to each other. In order for two cells to be vertically adjacent and joined at congruent edges, their congruent edges must have opposite geometric sense. The same relation is true in the orthogonal direction. In general, a cell 344 with four serrated edges can have $2^4$=16 combinations of edges.

Although an arrangement is illustrated in FIG. 17 in which the $e_1$ direction is vertical to enable power and ground routing parallel to the column direction, it is of course within the scope of the invention to rotate the coordinate system by 90° so that the $e_1$ direction is horizontal and runs parallel to the row direction. This would enable cells to be arranged in rows, rather than in columns as illustrated.

If cells are arranged in columns, they have equal widths (within each column) and can have equal or unequal heights. If cells are arranged in rows, they have equal heights and can have equal or unequal widths.

The most desirable configuration of the present invention is one in which the cells are closely packed on the substrate with 100% space utilization, and the routing interconnects are provided in three layers that are electrically insulated from each other and from the cells on the substrate. However, the invention is not limited to this or any of the exemplary configurations that are explicitly described and illustrated.

Figure 18:
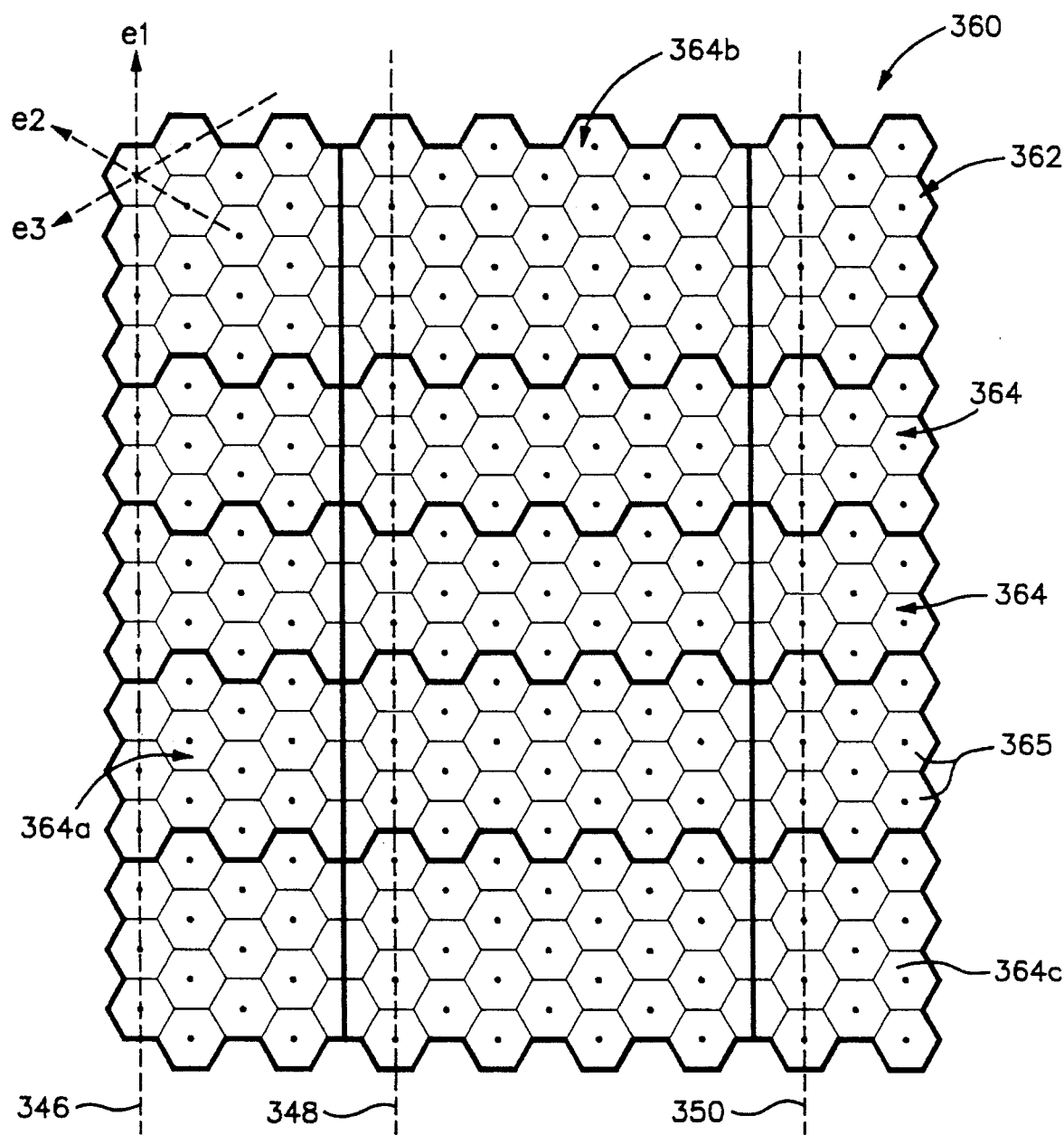
FIG. 18 is similar to FIG. 17, but illustrates cells having two serrated edges and one or two straight edges.

It is not necessary within the scope of the invention for all of the edges of a cell to be serrated and defined by edges of hexagons. FIG. 18 illustrates an integrated circuit 360 comprising a substrate 362 on which are formed cells 364 having upper and lower serrated edges as described above with reference to FIG. 17. However, the cells 364 have at least one vertical edge that is straight and not defined by edges of hexagons 365. For example, a cell 364a has a serrated left edge and a straight right edge, a cell 364b has straight right and left edges and a cell 364c has a straight left edge and a serrated right edge.

The number of possible edge configurations for the cells of FIG. 18 is $2^2$=4 for cells 364 having two straight edges, and $2^3$=8 for cells 364 having one straight edge.

Figure 19:
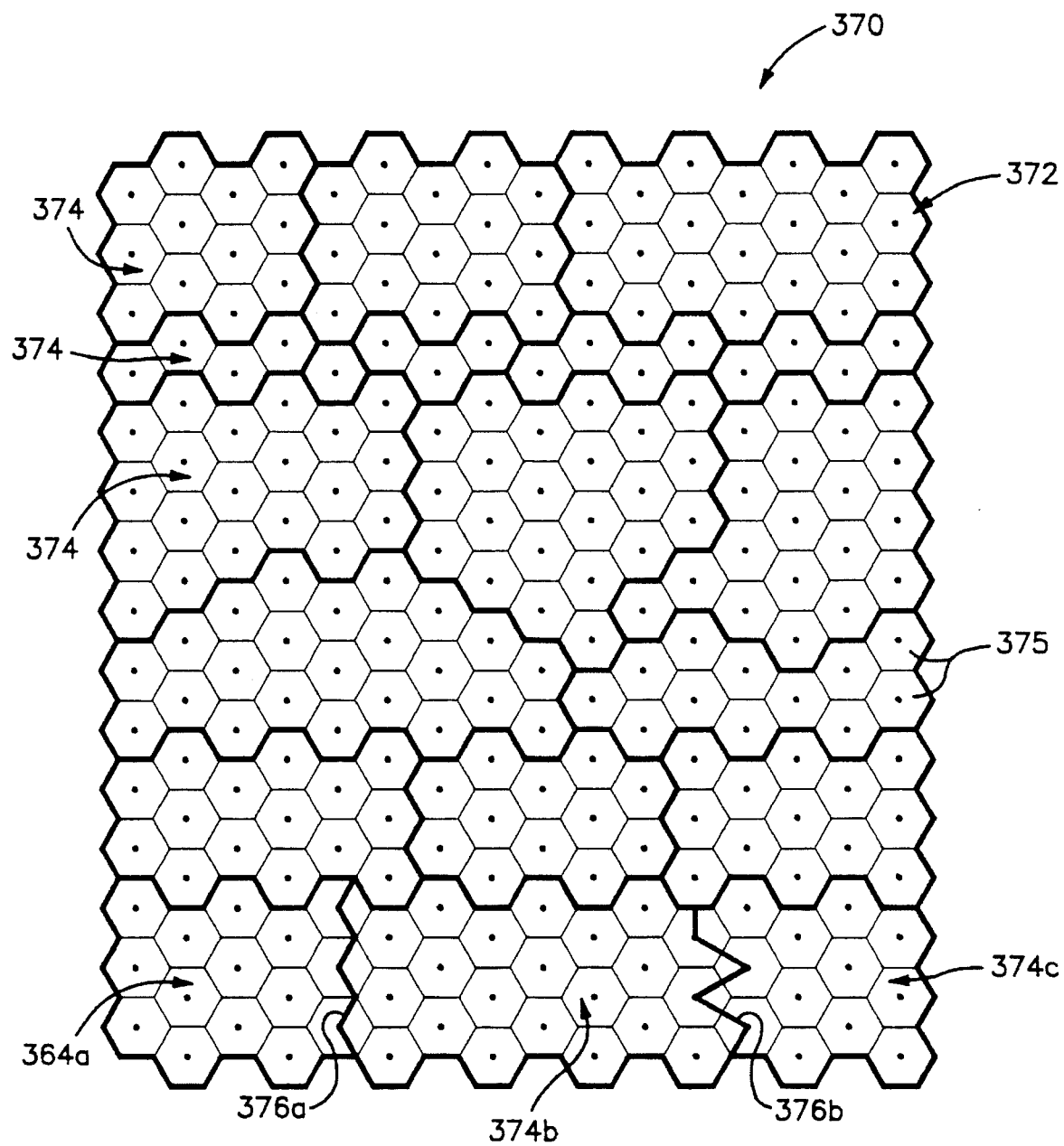
FIG. 19 is also similar to FIG. 17, but illustrates cells having irregular shapes with serrated edges.

It is further not necessary within the scope of the present invention for a cell to have any regular shape. FIG. 19 illustrates an integrated circuit 370 comprising a substrate 372 having cells 374 formed thereon that have highly irregular shapes. The cells 374 are illustrated as being closely packed to provide 100% space utilization, although the scope of the invention includes providing spaces and/or routing tracks between cells.

Most of the cells 374 have all of their edges defined by edges of hexagons. However, the circuit 370 further comprises a cell 374a having a right edge 376a that is not defined by edges of hexagons 375 and is not straight. The right edge 376a of the cell 374a is congruent with the left edge of a cell 374b, which has an irregular right edge 376b that is congruent with the left edge of a cell 374c.

The freeform cell capability of FIG. 19 can be advantageously utilized in an application where a cell can be designed with a given functionality but have a shape that is variable within specified parameters. If, for example, an initial placement of regularly shaped cells produces an unroutable design with irregularly shaped gaps therein, the freeform design can be employed to generate cells that can fill the gaps and provide the required functionality and routability.

Figure 20:
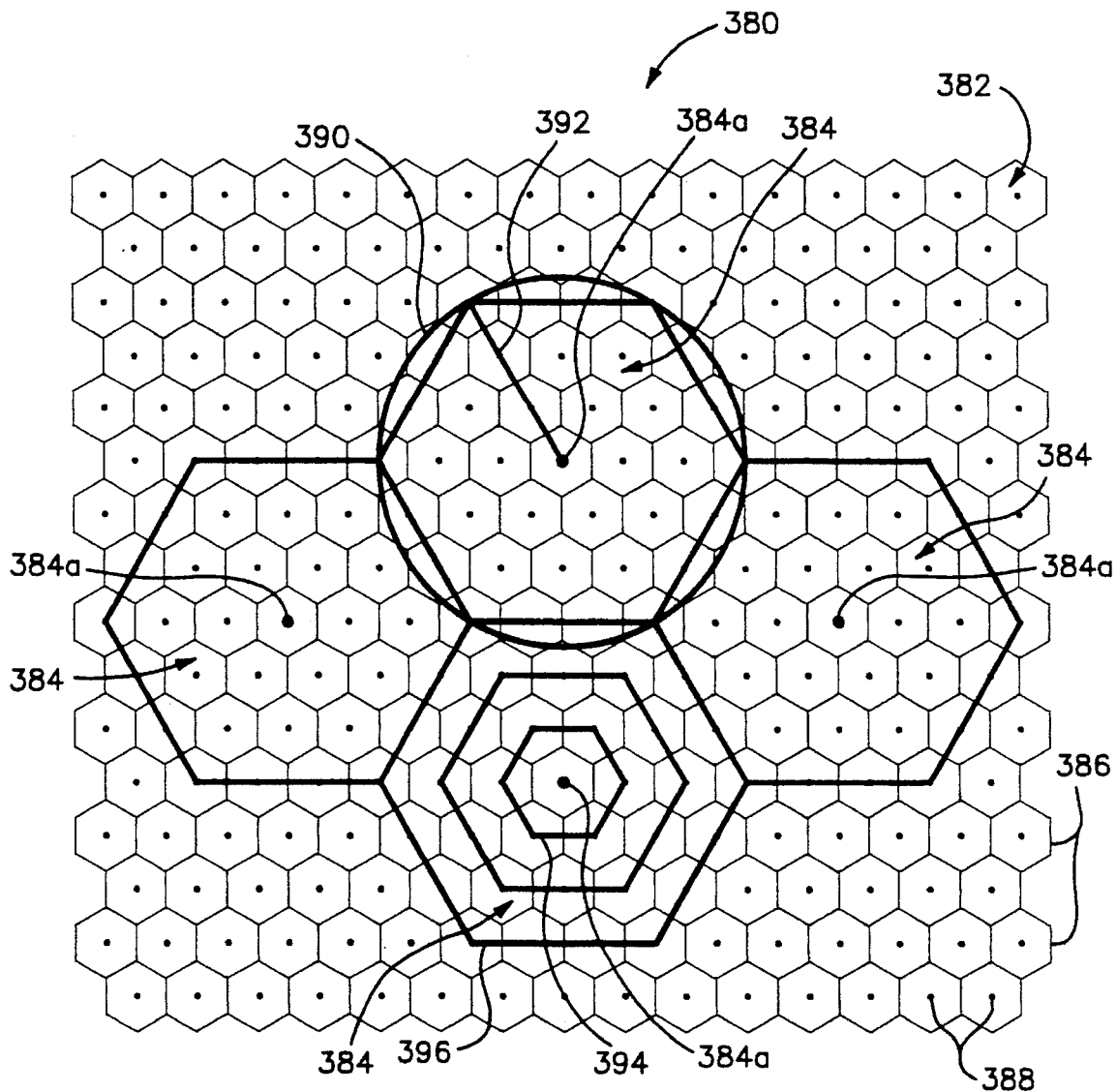
FIG. 20 is a diagram illustrating closely packed hexagonal cells with terminals at centers of smaller hexagons disposed inside the cells.

FIG. 20 illustrates another integrated circuit 380 embodying the present invention which comprises a substrate 382 having a plurality of closely packed cells 384 formed thereon. The cells 384 are hexagonal in shape and have centers 384a.

A three directional routing grid for the cells 384 is provided by superimposing a pattern of smaller hexagons 386 having centers 388 on the substrate 382. The centers 388 define locations for terminals of the cells 384 in the manner described above. The pattern of small hexagons 388 is aligned with the cells 384 such that the centers 384a of the cells 384 are coincident with centers 388 of the hexagons 386.

The small hexagons 386 have dimensions that are integral fractions of selected dimensions of the cells 384. In the illustrated example, a circle 390 that circumscribes one of the cells 384 has a radius 392 that is three times the distance between the centers 388 of adjacent hexagons 386.

However, the invention is not so limited, and the sizes of the cells 384 can be related to the sizes of the hexagons 388 in different ways. For example, cells 394 and 396 are illustrated that are circumscribed by circles (not shown) having radii that are equal to one and two times the distance between the centers 388 of the small hexagons respectively. The size relationship between the cells 384 and the hexagons 386 can also be defined by ratios of edge lengths, inscribed circles and other dimensions in various combinations.

In to facilitate the design of an integrated circuit, it is advantageous to provide a library including sets of cells having the same functionality but different shapes. This enables a cell having the required functionality to be placed in slots of different shapes on a substrate.

Figure 21:
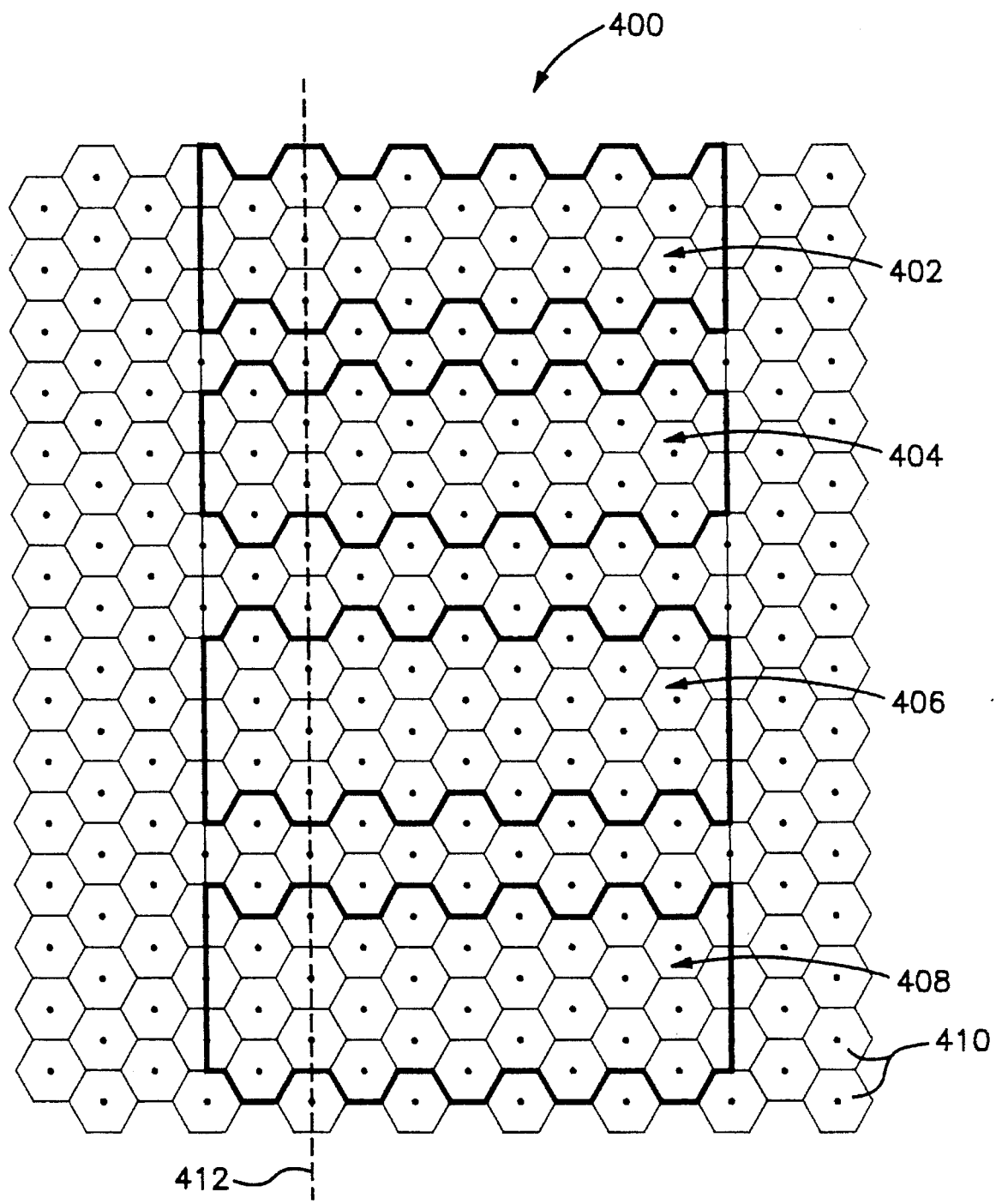
FIG. 21 is a diagram illustrating a set of functionally similar cells having different edge shapes.

Such a set 400 is illustrated in FIG. 21, and comprises four cells 402, 404, 406 and 408 having the same predetermined functionality. The cells 402, 404, 406 and 408 are generally rectangular in shape, and each have upper and lower serrated edges defined by edges of a superimposed pattern of hexagons 410, and straight left and right edges. It will be noted that the cells 402, 404, 406 and 408 are defined by different numbers of hexagons, and are not exactly the same size.

The cell 402 has female upper and lower edges as defined by a line 412. The cell 404 has male upper and lower edges. The cell 406 has a male upper edge and a lower female edge, whereas the cell 408 has a female upper edge and a male lower edge. The cells 402 and 404 are defined by a first number of hexagons, whereas the cells 406 and 408 are defined by a second number of hexagons that is different from the first number.

Since the cells 402, 404, 406 and 408 have only two serrated edges, the set comprises $2^2$=4 cells. A set of generally rectangular cells having four serrated edges would consist of $2^4$=16 cells.

In summary, the present invention substantially reduces the total interconnect wirelength of an integrated circuit by providing three routing directions, rather than two routing directions as in the prior art. The routing directions include, relative to a first direction, two diagonal directions that provide shorter interconnect paths than conventional rectilinear routing.

In addition, the number of conductors that extend parallel to each other and the angles between conductors in different layers are smaller than in the prior art, thereby reducing parasitic capacitance and other undesirable effects that result from conventional rectilinear routing.

Various modifications will become possible for those skilled in the art after receiving the teachings of the present disclosure without departing from the scope thereof.

We claim:

1. A microelectronic structure, comprising:

a substrate;

a plurality of microelectronic cells formed on the substrate, each cell including at least one serrated edge defined by edges of a plurality of closely packed hexagons superimposed on the substrate, each cell comprising an interconnection terminal disposed at a center of one of said hexagons; and a plurality of first and second electrical conductors that extend in first and second directions for interconnecting selected terminals in a predetermined manner respectively; in which the first and second conductors pass through said centers of said hexagons and extend perpendicular to edges of said hexagons.

2. A structure as in claim 1, in which the first and second conductors are formed in first and second layers that are electrically insulated from each other respectively.

3. A microelectronic structure as in claim 2, in which the cells are formed in said first layer.

4. A structure as in claim 1, in which the cells and the first and second electrical conductors are formed in a same layer.

5. A structure as in claim 1, further comprising a plurality of third electrical conductors that extend in a third direction for interconnecting selected terminals in a predetermined manner; in which the third electrical conductors pass through centers of said hexagons; and the third electrical conductors extend perpendicular to edges of said hexagons.

6. A structure as in claim 5, in which the first, second and third conductors are formed in first, second and third layers that are electrically insulated from each other respectively.

7. A structure as in claim 6, in which the first, second and third layers are electrically insulated from the substrate.

8. A structure as in claim 7, in which the cells are substantially closely packed on the substrate.

9. A structure as in claim 5, further comprising a plurality of fourth electrical conductors that extend in a fourth direction that is substantially perpendicular to said first direction for interconnecting selected terminals in a predetermined manner.

* * * * *

UNITED STATES PATENT AND TRADEMARK OFFICE
CERTIFICATE OF CORRECTION

PATENT NO.   : 5,578,840
DATED        : November 26, 1996
INVENTOR(S)  : R. Scepanovic, et al.

It is certified that error appears in the above-indentified patent and that said Letters Patent is hereby corrected as shown below:

On the title page, item
    [73], in the name of the Assignee, please change
"LIS LOGIC" to -- LSI LOGIC --.

Signed and Sealed this

Fourth Day of February, 1997

Attest:

BRUCE LEHMAN

*Attesting Officer*   *Commissioner of Patents and Trademarks*